(12) United States Patent
Yang et al.

(10) Patent No.: US 9,986,657 B2
(45) Date of Patent: May 29, 2018

(54) FIXING APPARATUS AND ELECTRONIC EQUIPMENT USING THE SAME

(71) Applicant: CLOUD NETWORK TECHNOLOGY SINGAPORE PTE. LTD., Singapore (SG)

(72) Inventors: Tzu-Cheng Yang, New Taipei (TW); Hung-Chun Lu, New Taipei (TW)

(73) Assignee: Cloud Network Technology Singapore Pte. Ltd., Singapore (SG)

( * ) Notice: Subject to any disclaimer, the term of this patent is extended or adjusted under 35 U.S.C. 154(b) by 0 days. days.

(21) Appl. No.: 15/252,239

(22) Filed: Aug. 31, 2016

(65) Prior Publication Data

US 2018/0007804 A1   Jan. 4, 2018

(30) Foreign Application Priority Data

Jul. 4, 2016   (CN) .......................... 2016 1 0510819

(51) Int. Cl.
*H05K 7/20*   (2006.01)
*H05K 7/14*   (2006.01)
*H05K 5/02*   (2006.01)

(52) U.S. Cl.
CPC ......... *H05K 7/1401* (2013.01); *H05K 5/0217* (2013.01); *H05K 7/14* (2013.01)

(58) Field of Classification Search
CPC ...... G06F 1/1656; G06F 1/1658; G06F 1/185; G06F 1/18
See application file for complete search history.

(56) References Cited

U.S. PATENT DOCUMENTS

| | | | | |
|---|---|---|---|---|
| 4,509,810 A * | 4/1985 | Erlam | ..................... | A47B 88/43 361/726 |
| 5,813,793 A * | 9/1998 | Baucom | ............... | H05K 5/0021 292/127 |
| 7,864,538 B2 * | 1/2011 | Wadsworth | ............ | G11B 33/10 361/679.02 |
| 8,189,327 B2 * | 5/2012 | Chang | ..................... | G06F 1/187 361/679.01 |
| 8,391,004 B2 * | 3/2013 | Watanabe | ............ | G11B 33/123 361/679.38 |
| 8,568,151 B2 * | 10/2013 | Cheng | ................... | G06F 1/1656 361/679.38 |
| 8,677,381 B2 * | 3/2014 | Kawakami | ............. | G11B 17/08 360/92.1 |
| 8,902,579 B1 * | 12/2014 | Lalouette | ................ | G06F 1/187 361/679.33 |
| 9,134,772 B2 * | 9/2015 | Zhang | ..................... | G06F 1/187 |
| 2003/0080568 A1 * | 5/2003 | Busby | .................... | A47B 81/06 292/197 |
| 2004/0212966 A1 * | 10/2004 | Fisher | .............. | G06K 19/07732 361/726 |
| 2006/0133030 A1 * | 6/2006 | Takahashi | ............... | G06F 1/184 361/679.36 |

(Continued)

*Primary Examiner* — Anthony Q Edwards
(74) *Attorney, Agent, or Firm* — ScienBiziP, P.C.

(57) ABSTRACT

A fixing apparatus for an electronic device to be installed in a cabinet includes a housing fixed in the electronic device and a latch member with one end rotatably mounted in the housing. The housing includes an opening for the latch member to pass through and the other end of the latch member includes a blocking member. The blocking member is rotatable between an unlocking position and a locked position. An electronic equipment is further disclosed.

20 Claims, 8 Drawing Sheets

(56) References Cited

U.S. PATENT DOCUMENTS

| | | | |
|---|---|---|---|
| 2010/0208423 A1* | 8/2010 | Lai | G06F 1/187 361/679.38 |
| 2010/0232116 A1* | 9/2010 | Paratore | G06F 3/03545 361/724 |
| 2013/0034980 A1* | 2/2013 | Lu | H05K 7/1492 439/153 |
| 2013/0070415 A1* | 3/2013 | Terry | G06F 1/187 361/679.38 |
| 2015/0355686 A1* | 12/2015 | Heyd | G06F 1/187 361/679.31 |

* cited by examiner

FIXING APPARATUS AND ELECTRONIC EQUIPMENT USING THE SAME

FIELD

The subject matter herein generally relates to fixing apparatus.

BACKGROUND

A container-type data center can be used by equipment manufacturers. A container-type data center generally includes a cabinet in which multiple servers are locked. A handle hook is installed in an end of the server to remove the server from the cabinet. The handle hook is itself large. However, the size of the servers is getting reduced and the operating space for the handle hook is now limited.

BRIEF DESCRIPTION OF THE DRAWINGS

Implementations of the present technology will now be described, by way of example only, with reference to the attached figures.

DETAILED DESCRIPTION

Figure 1:
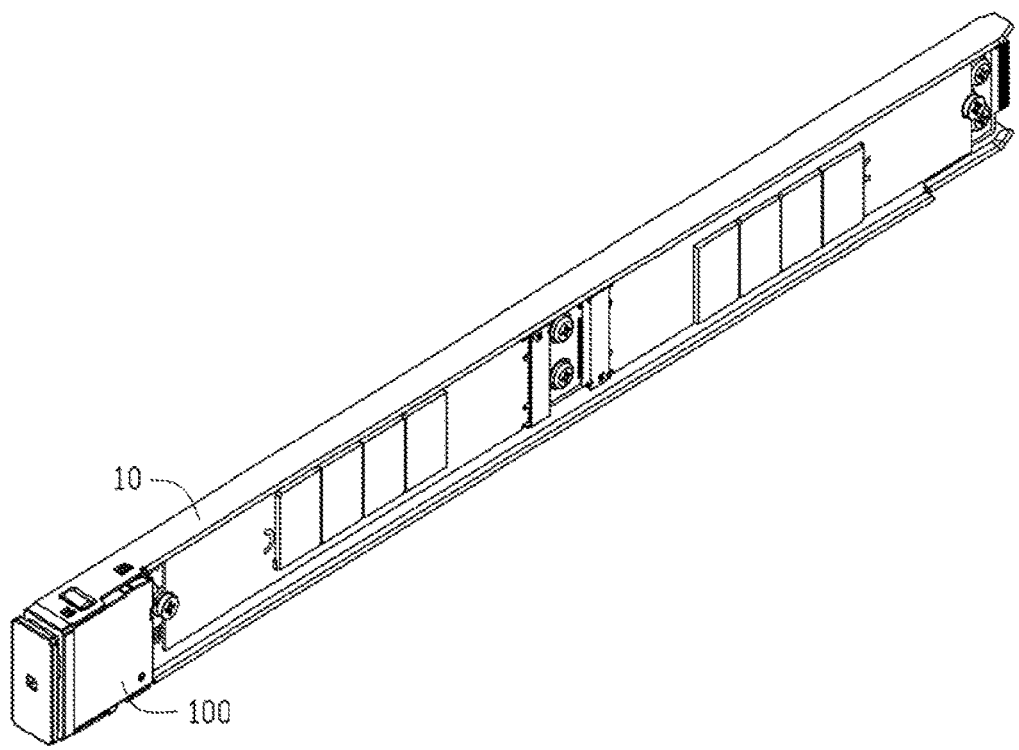
FIG. 1 is an isometric view of one embodiment of a fixing apparatus and an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

The present disclosure is described in relation to a housing of an electronic device.

FIG. 1 illustrates one embodiment of a fixing apparatus 100 fixed in an electronic device 10 to install the electronic device 10. The electronic device 10 can be slid to be fixed to an enclosure (not shown). The enclosure can be a cabinet.

Figure 2:
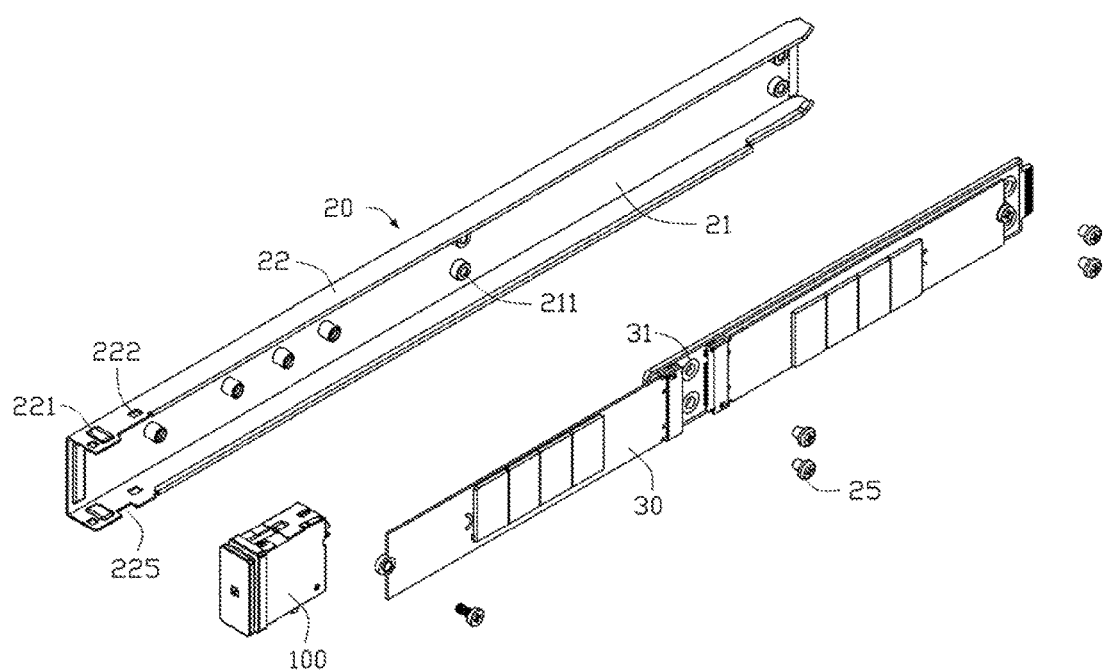
FIG. 2 is an exploded view of the fixing apparatus and electronic device of FIG. 1.
Figure 3:
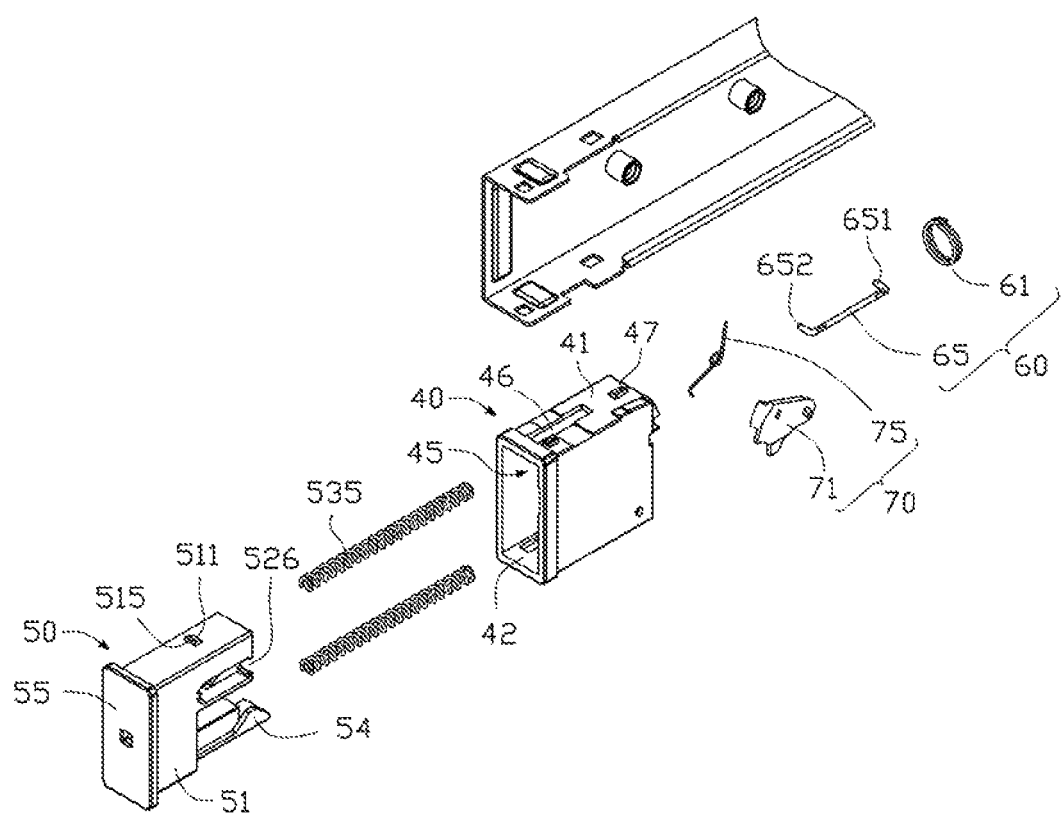
FIG. 3 is an exploded view of a base and the fixing apparatus of FIG. 1.
Figure 4:
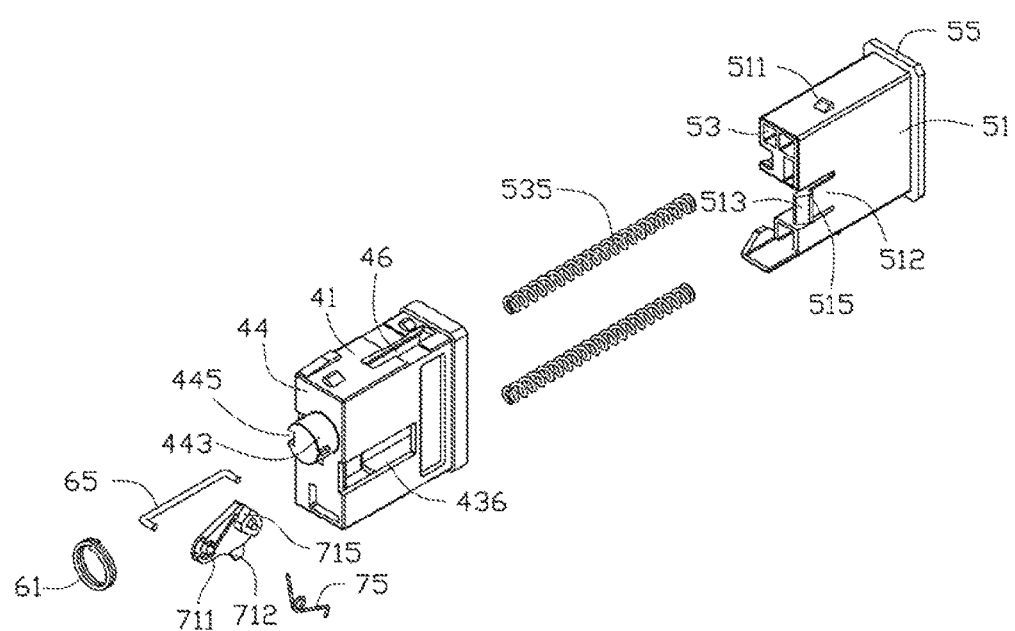
FIG. 4 is an exploded view of the fixing apparatus of FIG. 3 from a different viewing angle.
Figure 5:
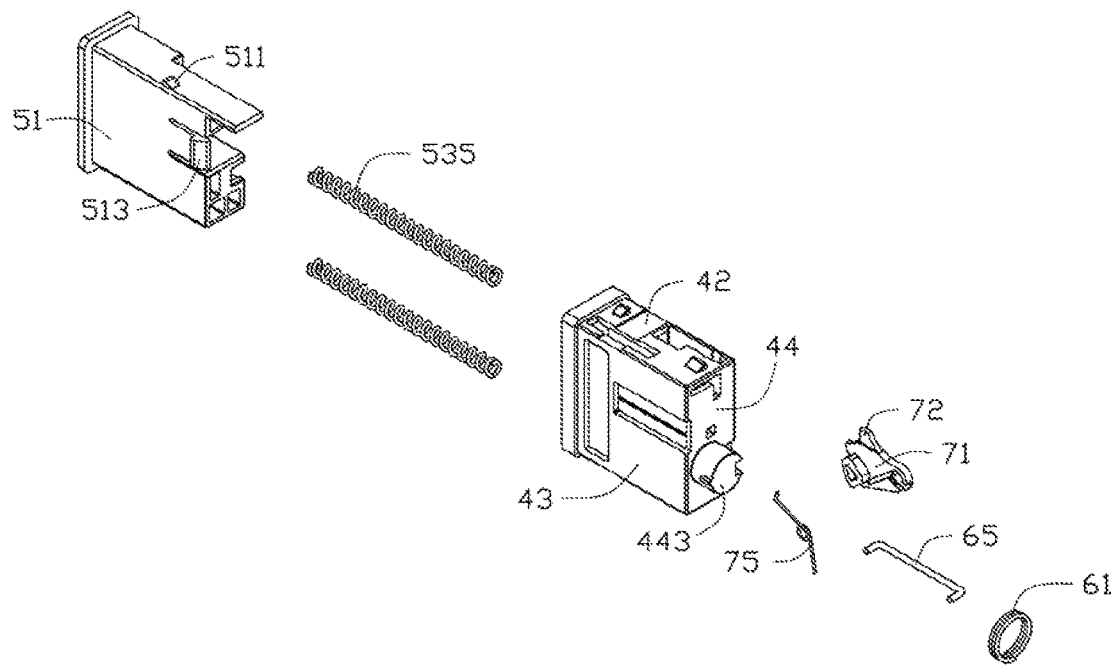
FIG. 5 is an exploded view of the fixing apparatus of FIG. 3 from another viewing angle.
Figure 6:
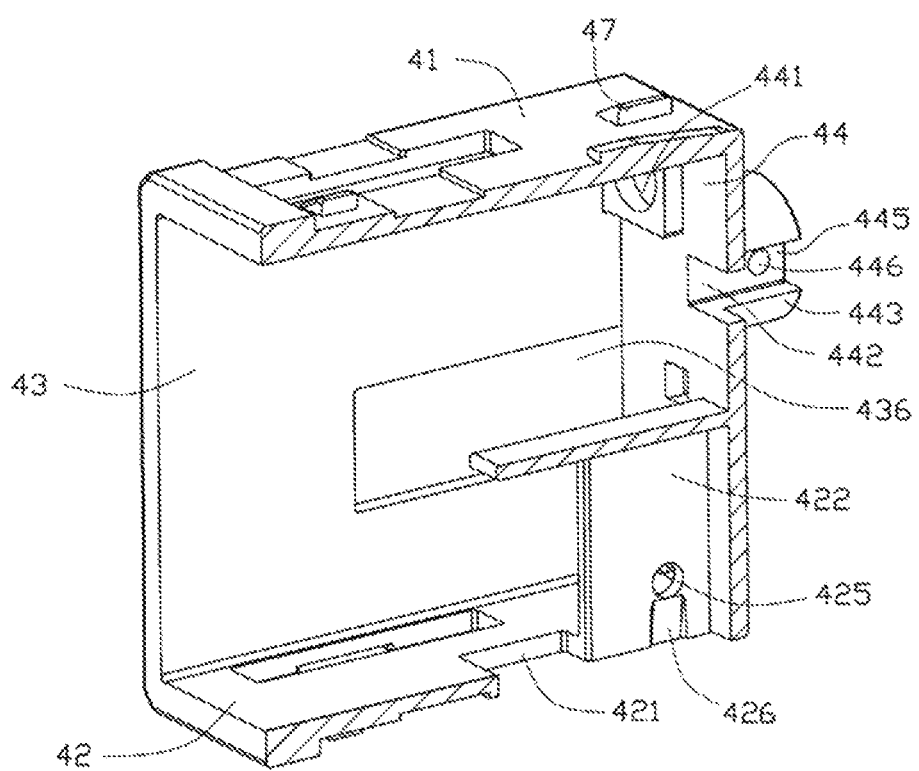
FIG. 6 is a sectional view of a housing of FIG. 3.

Referring to FIG. 1 and FIG. 2, the electronic device 10 includes a base 20 and a plurality of electronic components 30 mounted on the base 20. The base 20 includes a base board 21 and two side boards 22 perpendicularly connected to opposite sides of the base board 21. The base board 21 defines a plurality of mounting holes 211, and a plurality of mounting parts 25 passing through the electronic components 30 to insert into the mounting holes 211 and thereby mount the electronic components 30 to the base 20. Each of the outer surfaces of the side boards 22 has a roller 221. The roller 221 is used to slide the electronic device 10 to fix the electronic device 10 to the cabinet. Each of the side boards 22 defines two locking holes 222, the fixing apparatus 100 can be locked with the locking holes 222. One of the side boards 22 includes a gap 225. The electronic device 30 includes a plurality of fixing holes 31, the mounting parts 25 can pass through the mounting holes 31.

Referring to FIG. 3 to FIG. 6, the fixing apparatus 100 includes a housing 40, a sliding button 50 fixed to the housing 50, a buckle unit 60 mounted in the housing 40, and a latch unit 70 mounted in the housing 40.

The housing 40 includes a top plate 41, a bottom plate 42 parallel to the top plate 41, two side plates 43, and a back plate 44 connected between the bottom plate 42 and the top plate 41. A receiving space 45 is defined by the top plate 41, the bottom plate 42, the side plates 43, and the back plate 44 together for receiving the button 50 An opening or socket is formed in the front of the receiving space 45 for the button 50 to pass through. Both the top plate 41 and bottom plate 42 include a slot 46, and the button 50 can be inserted into the slot 46 and slide along the slot 46. The outer sides of the top plate 41 and the bottom plate 42 define two protrusions 47, the protrusions 47 can be clamped to the locking hole 222 to mount the housing 40 to the base 20 of the electronic device 10.

The bottom plate 42 further defines an opening 421, the latch unit 70 can pass through the opening 421 and be received in the receiving space 45. The bottom plate 42 includes a mounting plate 422 protruding from the side of the opening 421 to the receiving space 45. The mounting plate 422 defines a pivot hole 425 and a slant 426 under the pivot hole 425 to enable the latch unit to pass through. The side plate 43 abutting the opening 421 includes a pivot hole 435. The other side plate 43 includes a sliding slot 436, the button 50 can be inserted into the sliding slot 436 and slide along the sliding slot 436. The inner surface of the back plate 44 defines a receiving hole 441 on the upper end and on the lower end. The back plate 44 also defines a through hole 442. A position column 443 is defined on the outer side of the back plate 44 near the through hole 442, the position column 443 includes a groove 445, the groove 445 and the through hole 442 being interconnected. The groove 445 further includes a fasten hole 446.

Referring to FIG. 3 to FIG. 5, and FIG. 7 to FIG. 8, the button 50 includes a main body 51 and an operating board 55 connected to the main body 51. A protrusion 511 is defined on the top and on the bottom of the main body 51. The protrusions 511 can be inserted into the sliding slot 46 of the housing 40. One side of the main body 51 defines an elastic fasten board 512. The fasten board 512 includes a protrusion 513 on the end, the fasten board is deformed when the protrusion 513 is inserted into the sliding slot 436. One end of the protrusion 511 and of the protrusion 513 defines a block plane 515 to prevent the main body 51 from separating from the housing 40.

A buckle part 52 is defined inside the main body 51 and the end of the buckle part 52 abutting the operating board 55 defines a leading block 521. The buckle part 52 includes a buckle slot 522, the buckle unit 60 can be mounted to the buckle slot 522. The buckle part 52 forms a first track 523 under the buckle slot 522 and forms a second track 524 upon the buckle slot 522. The buckle part 52 also forms a sliding track 525 on an end away from the leading block 522, the sliding track 525 being connected between the first track 523 and the second track 524. The bottom surface of the first track 523 is over the bottom surface of the sliding track 525. The buckle unit 60 can slide from the first track 523 to the sliding track 525, and slide from the sliding track 525 to the second track 524. The buckle part 52 further defines a front opening 526 on an end away from the leading block 521, the buckle unit can pass through the front opening 526. The upper and lower end of the main body 51 each define a hollow socket 53, each of the sockets 53 includes an elastic part 535 inside. An unlocking plate 54 is located under the lower side of the main body 51 abutting the mounting plate 422, the unlocking plate 54 can be resist against the latching unit 70. The operating board is mounted to an end of the main body 51 so as to easily slide the button 50.

Referring again to FIGS. 3-5, the buckle unit 60 includes a mounting part 61 and a fastener 65. The mounting part 61 can be elastically expanded and fixed to the position column 443 of the housing 40. Each of the two ends of the fastener 65 is bent to form a hook 651. The hook 651 on one end of the fastener 65 is mounted to the fasten hole 446 on the position column 443, the hook 651 on the other end of the fastener 65 is mounted to the buckle slot 522 of the buckle part 52. Each of the two ends of the fastener 65 defines a resisting surface 652 abutting the hook 651, the mounting part 61 resists against the resisting surface 652 to compress the fastener 65.

The latching unit 70 includes a latch member 71 and a torsion spring 75. The two sides of the latch member each protrude to form a pivot 711. The pivots 711 can be inserted into the pivot holes 435 on the side plate 43 and the pivot holes 425 on the mounting plate 422 so that the latch member 71 can be rotatably mounted in the housing 40. A resist block 715 can be formed on one end of the latch member 71, the torsion spring 75 can be sheathed on the pivot 711 to abut the resist block 715. A latching block 72 can be formed on another end of the latch member 71, the unlocking plate 54 of the button 50 can resist against the latching block 72 to drive the latch member 71 to rotate. The torsion spring 75 includes two torsion bars 751 resisting against the inner side of the back plate 44 and against the resist block 715 of the latch member 71.

Figure 7:
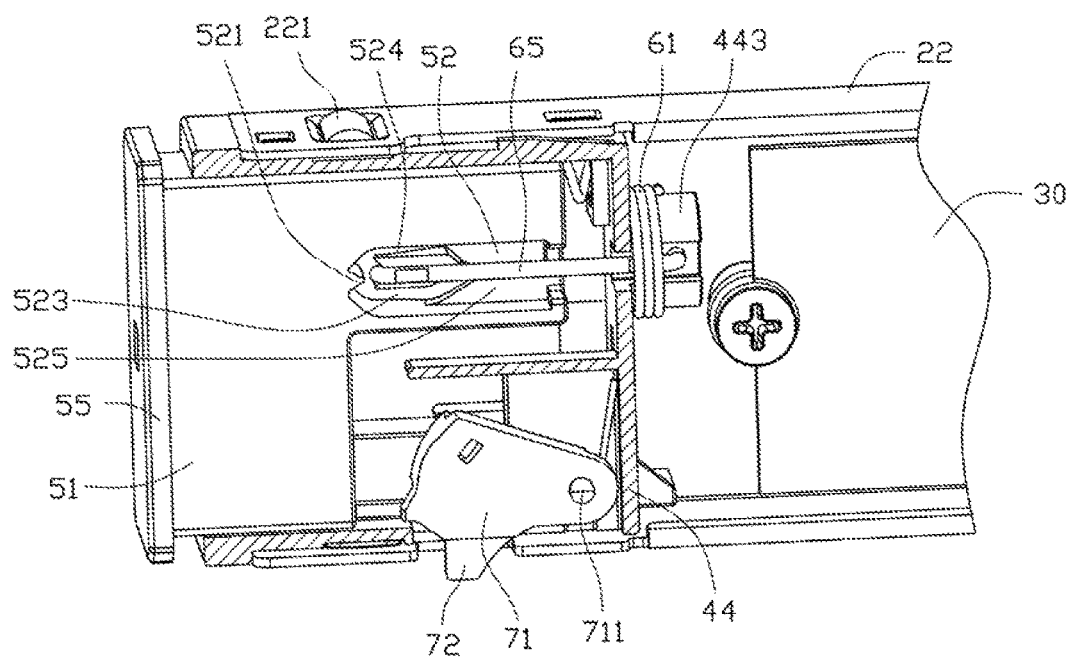
FIG. 7 is a perspective view of the fixing apparatus and electronic device of FIG. 1.

Referring to FIG. 1 and FIG. 7, in the process of assembling, the electronic components 30 are placed on the base 20. The fixing holes 31 of the electronic components 30 are aligned with the mounting holes 211 and a plurality of mounting parts 25 are inserted through the fixing holes 31 into the mounting holes 211, to fix the electronic components 30 to the base 20.

The hook 651 on one end of the fastener 65 is mounted to the fasten hole 446 on the position column 443. The hook on the other end of the fastener 65 is received in the receiving space 45 after passing through the through hole 442 on the back plate 44. The mounting part 61 is sheathed on the position column 443 and the mounting part 61 is elastically compressed by resisting against the resisting surface 652 of the fastener 65, so as to compact the fastener 65 to fix the fastener 65 to the housing 40.

The two elastic parts 535 are placed in the two sockets with one end inserted into the sockets. The button 50 is received in the receiving space 45 of the housing 40. When the button 50 is pushed towards the receiving space 45, the protrusions 511 on the top and bottom of the button 50 are inserted into the sliding slot 46 and slide along the sliding slot 46. The fasten board 512 is deformed to enable the protrusions 513 to slide over the side plate 43 of the housing 40. The fasten board 512 then restores to drive the protrudes 513 to slide into the sliding slot 436. The hook 651 received in the receiving space 45 passes through the front opening 526 of the button 50 to be received in the sliding track 525 of the buckle part 52. The hook 651 slides along the second track 524 until it is received in the buckle slot 522 of the buckle part 52, so that the hook 651 can prevent the button from moving out of the receiving space 45. The other ends of the two elastic parts 535 are elastically compressed to be inserted into the receiving holes 441 of the back plate 44. The button 50 is now slid to be fixed in the housing 40, and the operating board 55 of the button 50 maintains a distance from the housing 40.

The torsion spring 75 is then sheathed on the pivot 711 abutting the resist block 715. One of the torsion bars 751 resists against the resist block 715. The latch member 71 is received into the receiving space 45 via the opening 421 of the bottom plate 42. The pivots 711 are then inserted into the pivot hole 435 on the side plate 43 and the pivot hole 425 on the mounting plate 422, so that the latch member 71 can be rotatably mounted in the housing 40. The other one of two torsion bars 751 of the torsion spring 75 resists against the inner side of the back plate 44. Two torsion bars 751 resist against the resist block 715 under elastic restoring force to ensure that the latching block 72 of the latch member 71 is received in the opening 421. The fixing apparatus 100 is thereby completely assembled.

The fixing apparatus 100 is positioned to the base 20 and the protrusions 47 of the top plate 41 and the bottom plate 42 are clamped to the locking hole 222 to mount the fixing apparatus 100 to the base 20. The latching blocks 72 of the latch member 71 are received in the opening 421 of the bottom plate 42 and the gap 225 of the side plate 22. The electronic device 10 is thus fixed to the cabinet, the rollers 221 mounted on each of the outer surfaces of the side boards 22 rotate in the cabinet to allow the electronic device 10 to slide and be fixed in the cabinet. The latching blocks 72 of the latch member 71 take hold of the cabinet to prevent the electronic device 10 from moving out.

Figure 8:
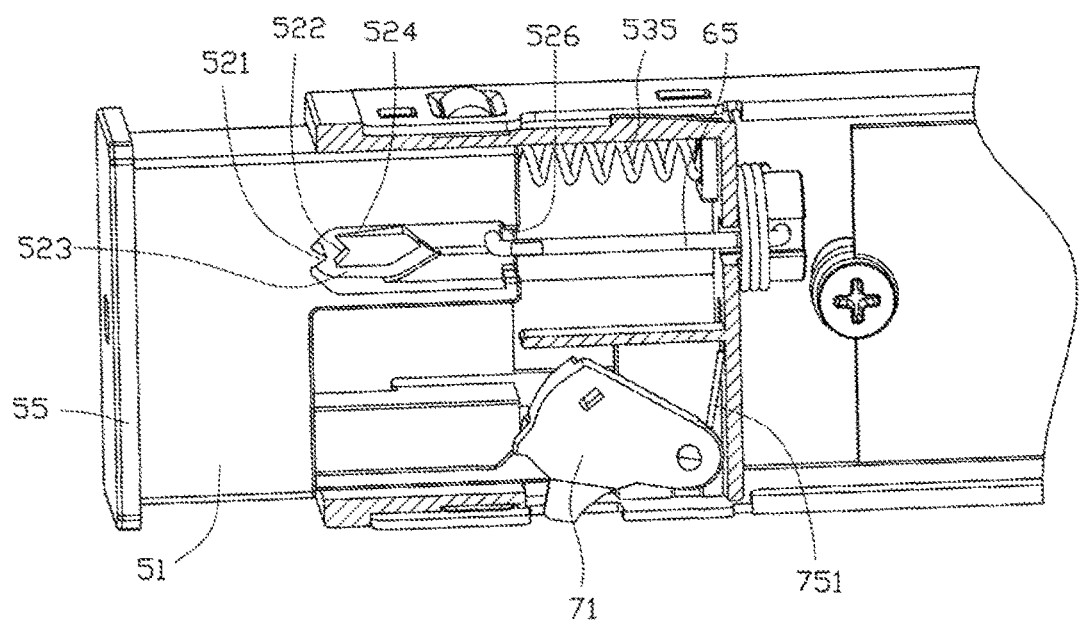
FIG. 8 is another perspective view of the fixing apparatus and electronic device of FIG. 1.

Referring to FIG. 8, when the electronic device 10 needs to be removed from the cabinet, the operating board 55 is pushed towards the receiving space 45. The protrusions 511 and 513 on the button 50 slide along the sliding slot 46 and the sliding slot 436. The leading block 521 of the buckle part 52 resists against the hook 651 to force the hook 651 to separate from the buckle slot 522 and to be received in the first track 523, the two elastic parts 535 being elastically compressed by the socket 53.

When the pushing force on the operating board 55 stops, the two elastic parts 535 elastically recover to slide the button 50 away from the receiving space 45, the hook 651 sliding towards the sliding track 525 in the first track 523. The unlocking plate 54 of the button 55 resists against the latching blocks 72 of the latch member 71 to drive the latch member 71 to rotate, and the latching blocks 72 are separated from the opening 421 and the gap 225, and are received in the receiving space 45. Upon pulling the operating board 55, the block planes 515 of the protrusion 511 and the protrusion 513 resist against the housing 40 to drive the electronic device 10 to slide together with the housing 40. The electronic device 10 can thus be separated from the cabinet without any resistance from the latching blocks 72.

The embodiments shown and described above are only examples. Many details are often found in the art such as the other features of the housing of the electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A fixing apparatus for fixing an electronic device to an enclosure, the fixing apparatus comprising:
   a housing configured to be fixed in the electronic device;
   a latch member with one end rotatably mounted in the housing; and
   a button comprising an unlocking plate;
   wherein the housing comprises an opening for the latch member passing through; the other end of the latch member comprises a blocking member, the blocking member is rotatable between an unlocked position, where the blocking member is received within the housing and aligned with the opening and configured to disengage from the enclosure, and a locked position, where the blocking member extends out of the opening and configured to be engaged with the enclosure via the opening and a gap on the electronic device;
   wherein the button is slidably connected in the housing, when the button slides towards the latch member in the housing, the unlocking plate resists against the latch member and drives the latch member to rotate.

2. The fixing apparatus of claim 1, wherein the housing comprises a top plate and a bottom plate parallel with the top plate, at least one of the top plate and bottom plate comprises a slot; at least one end of the button comprises a bump received in the slot, the button slides in the housing via the bump.

3. The fixing apparatus of claim 2, wherein when the button slides towards the latch member in the housing, the blocking member disengages with the enclosure and retreats back to the housing from the opening and the gap.

4. The fixing apparatus of claim 3, wherein the latch member comprises a pivot, the housing comprises a pivot hole, the latch member is rotatably mounted in the housing by inserting the pivot to the pivot hole.

5. The fixing apparatus of claim 4, wherein the fixing apparatus further comprises a torsion spring sheathed on the pivot, the torsion spring comprises two torsion bars resisting against the housing and the latch member respectively.

6. The fixing apparatus of claim 5, wherein the housing further comprises a back plate, a location column is defined on the outer side of the back plate; the fixing apparatus further comprises a mounting part sheathed on the location column.

7. The fixing apparatus of claim 6, wherein the location column comprises a fasten hole, the fixing apparatus further comprises a fastener, each of the two ends of the fastener comprises a hook, the fastener is fixed to the housing by mounting the hook on one end of the fastener to the fasten hole.

8. The fixing apparatus of claim 7, wherein the button comprises a buckle part, the buckle part comprises a buckle slot, the back plate comprises a through hole, the hook on the other end of the fastener is mounted to the buckle slot via the through hole.

9. The fixing apparatus of claim 8, wherein the buckle part comprises a first track, a second track , and a sliding track around the buckle slot, the sliding track is connected between the first track and the second track, the hook mounted to the buckle slot slides from the first track to the second track by way of via the sliding track.

10. The fixing apparatus of claim 8, wherein the buckle part comprises a leading block abuts the buckle slot, when the button slides in the housing, the leading block forces on the hook to separate the hook with the buckle slot and lead the hook to the first track.

11. An electronic equipment comprising:
   a cabinet ;
   a fixing apparatus for an electronic device to installed to the cabinet, the fixing apparatus comprising:
   a housing configured to be fixed in the electronic device;
   a latch member with one end rotatably mounted in the housing; and
   a button comprising an unlocking plate;
   wherein the housing comprises an opening for the latch member passing through; the other end of the latch member comprises a blocking member, the blocking member is rotatable between an unlocked position, where the blocking member is received within the housing and aligned with the opening and configured to disengage from the enclosure, and a locked position, where the blocking member extends out of the opening and configured to be engaged with the enclosure via the opening and a gap on the electronic device;
   wherein the button is slidably connected in the housing, when the button slides towards the latch member in the housing, the unlocking plate resists against the latch member and drives the latch member to rotate.

12. The electronic equipment of claim 11, wherein housing comprises a top plate and a bottom plate parallel with the top plate, at least one of the top plate and bottom plate comprises a slot; at least one end of the button comprises a bump received in the slot, the button slides in the housing via the bump.

13. The electronic equipment of claim 12, wherein when the button slides towards the latch member in the housing, the blocking member disengages with the enclosure and retreats back to the housing from the opening and the gap.

14. The electronic equipment of claim 13, wherein the latch member comprises a pivot, the housing comprises a pivot hole, the latch member is rotatably mounted in the housing by inserting the pivot to the pivot hole.

15. The electronic equipment of claim 14, wherein the fixing apparatus further comprises a torsion spring sheathed on the pivot, the torsion spring comprises two torsion bars resisting against the housing and the latch member respectively.

16. The electronic equipment of claim 15, wherein the housing further comprises a back plate, a location column is defined on the outer side of the back plate; the fixing apparatus further comprises a mounting part sheathed on the location column.

17. The electronic equipment of claim 16, wherein the location column comprises a fasten hole, the fixing apparatus further comprises a fastener, each of the two ends of the fastener comprises a hook, the fastener is fixed to the housing by mounting the hook on one end of the fastener to the fasten hole.

18. The electronic equipment of claim 17, wherein the button comprises a buckle part, the buckle part comprises a buckle slot, the back plate comprises a through hole, the hook on the other end of the fastener is mounted to the buckle slot via the through hole.

19. The electronic equipment of claim 18, wherein the buckle part comprises a first track, a second track , and a sliding track around the buckle slot, the sliding track is connected between the first track and the second track, the hook mounted to the buckle slot slides from the first track to the second track by way of via the sliding track.

20. The electronic equipment of claim 18, wherein the buckle part comprises a leading block abuts the buckle slot, when the button slides in the housing, the leading block forces on the hook to separate the hook with the buckle slot and lead the hook to the first track.

* * * * *